(12) United States Patent
Cao et al.

(10) Patent No.: US 11,195,798 B2
(45) Date of Patent: Dec. 7, 2021

(54) TUNGSTEN ALLOYS IN SEMICONDUCTOR DEVICES

(71) Applicant: Intel Corporation, Santa Clara, CA (US)

(72) Inventors: Yang Cao, Beaverton, OR (US); Akm Shaestagir Chowdhury, Portland, OR (US); Jeff Grunes, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/300,569

(22) PCT Filed: Jul. 25, 2014

(86) PCT No.: PCT/US2014/048274
§ 371 (c)(1),
(2) Date: Sep. 30, 2016

(87) PCT Pub. No.: WO2016/014084
PCT Pub. Date: Jan. 28, 2016

(65) Prior Publication Data
US 2017/0018506 A1    Jan. 19, 2017

(51) Int. Cl.
*H01L 21/768* (2006.01)
*H01L 21/288* (2006.01)
*H01L 23/532* (2006.01)

(52) U.S. Cl.
CPC ...... *H01L 23/53261* (2013.01); *H01L 21/288* (2013.01); *H01L 21/76843* (2013.01);
(Continued)

(58) Field of Classification Search
CPC ............. H01L 21/288; H01L 21/76843; H01L 21/76849; H01L 23/53261; H01L 23/53238
See application file for complete search history.

(56) References Cited

U.S. PATENT DOCUMENTS 7,622,382 B2   11/2009  Chowdhury et al.
9,123,706 B2    9/2015  Zierath et al.
(Continued)

FOREIGN PATENT DOCUMENTS

CN    1320953    11/2001
CN    1784507     6/2006
(Continued)

OTHER PUBLICATIONS

Notice of Allowance from Chinese Patent Application No. 201480080028.9, dated Mar. 4, 2020, 4pgs.
(Continued)

*Primary Examiner* — Kenneth Parker
*Assistant Examiner* — Long H Le
(74) *Attorney, Agent, or Firm* — Schwabe, Williamson & Wyatt, P.C.

(57) ABSTRACT

Conducting alloys comprising cobalt, tungsten, and boron and conducting alloys comprising nickel, tungsten, and boron are described. These alloys can, for example, be used to form metal interconnects, can be used as liner layers for traditional copper or copper alloy interconnects, and can act as capping layers. The cobalt-tungsten and nickel-tungsten alloys can be deposited using electroless processes.

15 Claims, 5 Drawing Sheets

(52) U.S. Cl.
CPC .. *H01L 21/76849* (2013.01); *H01L 21/76877* (2013.01); *H01L 23/53209* (2013.01); *H01L 23/53238* (2013.01); *H01L 2924/0002* (2013.01)

(56) References Cited

U.S. PATENT DOCUMENTS

| | | | |
|---|---|---|---|
| 2001/0030366 A1* | 10/2001 | Nakano | H01L 21/288 257/758 |
| 2002/0081842 A1 | 6/2002 | Sambucetti et al. | |
| 2004/0026786 A1 | 2/2004 | Leu et al. | |
| 2004/0250755 A1 | 12/2004 | Ivanov | |
| 2005/0029669 A1 | 2/2005 | Inoue et al. | |
| 2005/0147762 A1* | 7/2005 | Dubin | C23C 18/31 427/437 |
| 2005/0230262 A1* | 10/2005 | Chen | C23C 18/165 205/122 |
| 2006/0063382 A1 | 3/2006 | Dubin et al. | |
| 2006/0188659 A1* | 8/2006 | Chen | C23C 18/36 427/437 |
| 2008/0119047 A1 | 5/2008 | Yu et al. | |
| 2008/0265416 A1 | 10/2008 | Lee et al. | |
| 2010/0107927 A1* | 5/2010 | Stewart | B82Y 30/00 106/1.22 |
| 2011/0124191 A1 | 5/2011 | Wirth | |
| 2011/0152151 A1* | 6/2011 | Kolics | C11D 3/245 510/175 |
| 2014/0027816 A1* | 1/2014 | Cea | H01L 29/66545 257/192 |
| 2015/0179578 A1* | 6/2015 | Jezewski | H01L 21/31144 257/768 |

FOREIGN PATENT DOCUMENTS

| | | |
|---|---|---|
| CN | 101188210 | 5/2008 |
| JP | S54-97515 A | 8/1979 |
| JP | 2003-142487 A | 5/2003 |
| JP | 2005-136217 | 5/2005 |
| JP | 2008-533702 | 8/2008 |
| JP | 2014-501452 | 1/2014 |
| KR | 10-0553620 | 2/2006 |
| TW | 200403768 | 3/2004 |
| TW | 200734482 | 9/2007 |
| WO | 2003094209 | 3/2003 |

OTHER PUBLICATIONS

Office Action from European Patent Application No. 14897922.2, dated Mar. 13, 2020, 6 pgs.
International Preliminary Search Report for International Patent Application No. PCT/US2014/048274, dated Feb. 9, 2017, 7 pages.
Search Report for European Patent App. No. 14897922.2, dated Feb. 22, 2018, 9 pages.
Notice of Allowance for Taiwan Patent App. No. 104119606, dated Sep. 2, 2016, 2 pages.
Office Action from Korean Patent Application No. 10-2016-7035978, dated Jan. 2, 2021, 8 pgs.
Notice of Allowance for Japanese Patent Application No. 2016-568938, dated Apr. 16, 2019, 11 pgs.
Office Action from Chinese Patent Application No. 201480080028.9, dated Mar. 20, 2019, 4pgs.
Office Action for Japanese Patent Application No. 2016-568938, dated Aug. 14, 2018, 8 pgs.
Office Action Received for Taiwanese Patent Application No. 104119606, dated Mar. 23, 2016, 6 Pages.
International Search Report and Written Opinion received for PCT Patent Application No. PCT/US2014/048274, dated Jan. 31, 2017, 8 pages.
Nakano, H., Itabashi, T., Akahoshi, H., "Electroless Deposited Cobalt-Tungsten-Boron Capping Barrier Metal on Damascene Copper Interconnection," Journal of the Electrochemical Society, 2005, C163-C166, 152 (3).
Search Report and Written Opinion for European Patent Application No. 14897922.2 dated Feb. 22, 2018, 9 pages.
Office Action from European Patent Application No. 14897922.2, dated Sep. 29, 2020, 4 pgs.
Office Action from Chinese Patent Application No. 201480080028.9, dated Sep. 25, 2019, 4pg.
Office Action from Korean Patent Application No. 10-2016-7035978, dated Jun. 25, 2021, 5 pgs.
Notice of Allowance from Korean Patent Application No. 10-2016-7035978, dated Aug. 18, 2021, 2 pgs.
Notice of Allowance from European Patent Application No. 14897922.2, dated Aug. 26, 2021, 2 pgs.

* cited by examiner

TUNGSTEN ALLOYS IN SEMICONDUCTOR DEVICES

CLAIM OF PRIORITY

This application claims the priority filing benefit of PCT Application No. PCT/US2014/048274, entitled "TUNGSTEN ALLOYS IN SEMICONDUCTOR DEVICES" filed on Jul. 25, 2014.

BACKGROUND FIELD

The disclosure relates to integrated circuit devices, metal alloys comprising tungsten, semiconductor device metallization, semiconductor device metal liner layers, and semiconductor device capping layers.

BACKGROUND INFORMATION

The desire for ever-smaller integrated circuit (IC) devices places enormous performance demands on the materials used to construct the devices. In general, an IC device is also known as a microchip, a semiconductor chip, an IC chip, or a chip. IC chips are found in a variety of common devices, such as, for example, the microprocessors in computers, cell phones, airplanes, cars, televisions, washing machines, and MP3 players (as well as many others). A plurality of IC chips are typically built on a silicon wafer (a thin silicon disk, having a diameter of, for example, 300 mm) and after processing the wafer is diced apart to create individual chips. A 1 cm$^2$ IC chip having feature sizes around of about 90 nm can comprise hundreds of millions of components. Current technologies are pushing feature sizes even smaller than 22 nm.

BRIEF DESCRIPTION OF THE FIGURES

The material described and illustrated is provided to exemplify aspects and is not meant to limit scope. For simplicity and clarity of illustration, elements illustrated in the figures are not necessarily drawn to scale. In the figures.

DETAILED DESCRIPTION

In the following description, various aspects and illustrative implementations are set forth in order to provide an understanding. However, embodiments may be practiced without one or more of the specific details that are described and frequently specific details of one embodiment may be practiced with other disclosed embodiments, as will be apparent to one of skill in the art. In other instances, well-known features are not described in detail in order not to obscure illustrative implementations.

Electronic connections between the component electronic devices in an integrated circuit (IC) chip are currently typically created using copper metal or alloys of copper metal. Component electronic devices include, for example, transistors, thyristors, resistors, and capacitors. Other types of devices are possible, the prior device listing is provided for illustration. Devices in an IC chip can be placed not only across the surface of an IC chip but devices can also be stacked in a plurality of layers on the IC chip. Electrical interconnections between component electronic devices that make up the IC chip are typically made using vias and trenches that are filled with conducting material. Layer(s) of insulating materials, frequently, low-k dielectric materials, separate component devices in the IC chip.

Conducting alloys comprising cobalt and tungsten and conducting alloys comprising nickel and tungsten are described and employed in semiconductor devices. These alloys can, for example, be used as metal interconnects between component devices, as liner layers for traditional copper or copper alloy interconnects, and as capping layers. The alloys can be deposited using electroless processes. In some embodiments, conducting cobalt-tungsten alloys comprise 15 to 45 atomic percent tungsten, 50 to 80 atomic percent cobalt, and 1 to 5 atomic percent boron. In alternate embodiments, conducting cobalt-tungsten alloys comprise 20 to 40 atomic percent tungsten, 55 to 75 atomic percent cobalt, and 1 to 5 atomic percent boron. In further alternate embodiments, conducting cobalt-tungsten alloys comprise 25 to 35 atomic percent tungsten, 60 to 70 atomic percent cobalt, and 1 to 5 atomic percent boron. In additional embodiments, conducting nickel-tungsten alloys comprise 15 to 45 atomic percent tungsten, 50 to 80 atomic percent nickel, and 1 to 5 atomic percent boron. In alternate embodiments, conducting nickel-tungsten alloys comprise 20 to 40 atomic percent tungsten, 55 to 75 atomic percent nickel, and 1 to 5 atomic percent boron. In further alternate embodiments, conducting nickel-tungsten alloys comprise 25 to 35 atomic percent tungsten, 60 to 70 atomic percent nickel, and 1 to 5 atomic percent boron.

Figure 1:
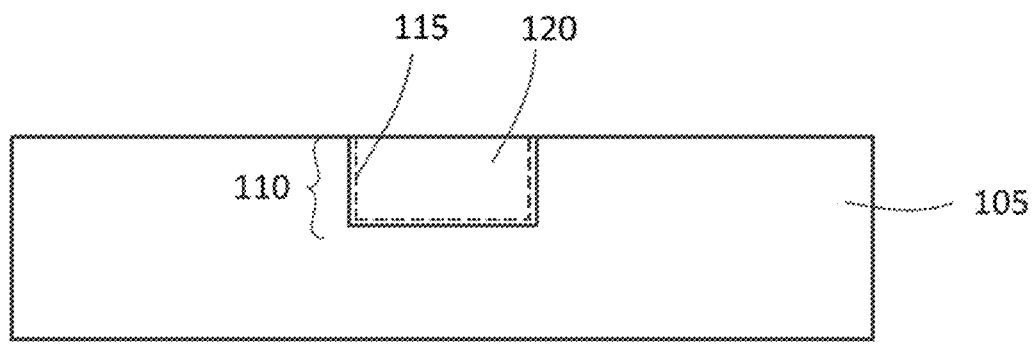
FIG. 1 is a schematic diagram illustrating a cross-sectional view of an electrical interconnect between component devices of an integrated circuit chip.

FIG. 1 illustrates a conducting alloy employed in an interconnect between component devices of an IC chip. In FIG. 1, only a small section of an IC chip is shown. Interconnects between devices can take the form of trenches or vias. The terms trenches and vias are commonly used to describe conducting interconnect features. In general, though, the feature that forms a metal interconnect can be a depression having any shape formed in a substrate or layer that has been deposited on the substrate. During semiconductor processing procedures, dielectric layers are patterned to create one or more trenches and or vias (or other features) within which conducting interconnects between devices are formed. The feature is then filled with metal interconnect material. The trenches and or vias may be patterned (created) using conventional wet or dry etch semiconductor processing techniques. Dielectric materials are used to electrically isolate metal interconnects from the surrounding components. Although, barrier layers are typically used between the metal interconnects and the dielectric materials to prevent metal (such as copper) migration into the surrounding materials, no barrier layer are present in embodiments of the invention. Barrier (liner) layers are used because device failure can occur, for example, when copper metal is in contact with dielectric materials because the copper metal can ionize and penetrate into the dielectric material. Advantageously, embodiments of the invention can avoid the use of copper and these associated issues.

In FIG. 1, a dielectric layer (or substrate) 105 comprises a depression 110. The electrical interconnect structure of FIG. 1 can be a trench interconnect structure. Vias are also possible, and in which case, the depression would typically be created through the dielectric layer 105. The dielectric layer 105 can be a material such as, for example, silicon dioxide, a low-k dielectric, silicon nitride, and or silicon oxynitride as discussed more fully herein. The dielectric layer 105 can be a single layer or multiple layers. The dielectric layer 105 can be layers of a single material or layers of different materials. The dielectric layer 105 contains depression 110 that has a fill 120 that is a conducting cobalt-tungsten alloy or a conducting nickel-tungsten alloy as described herein. The depression 110 is for example, a trench structure. Optionally, in FIG. 1, the conducting cobalt-tungsten alloy or conducting nickel-tungsten alloy material is in direct contact with the dielectric material 105 without an intervening liner or barrier layer. Not having a liner or barrier layer simplifies processes performed to make IC devices and provides improvements in performance since liner layers can exhibit higher resistances than the conducting material used for the interconnect. In alternate embodiments, an optional liner layer 115 is present between the conducting alloy and the dielectric layer 105. An optional liner layer 115 can line the inside of the depression 110. The optional liner layer 115 is comprised of a different material than a cobalt-tungsten alloy or a nickel-tungsten alloy.

Figure 2:
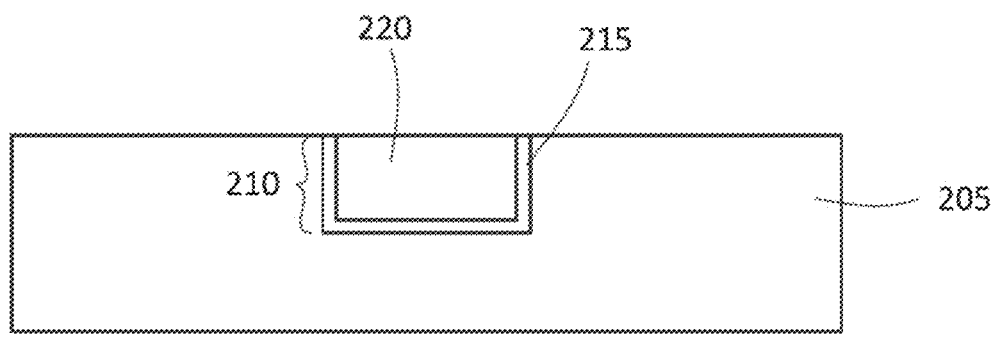
FIG. 2 is a schematic diagram illustrating a cross-sectional view of an additional electrical interconnect between component devices of an integrated circuit chip having a liner layer.

FIG. 2 illustrates a conducting alloy employed in a liner layer for an electrical interconnect in a semiconductor device. In FIG. 2, a small section of an IC chip is shown. In FIG. 2, a dielectric layer (or substrate) 205 comprises a depression 210. The electrical interconnect structure of FIG. 2 can be a trench interconnect structure. Vias are also possible, and in which case, the depression would typically be created through the dielectric layer 205. The dielectric layer 205 can be a material such as, for example, silicon dioxide, a low-k dielectric, silicon nitride, and or silicon oxynitride as discussed more fully herein. The dielectric layer 205 can be a single layer or multiple layers. The dielectric layer 205 can be layers of a single material or layers of different materials. The dielectric layer 205 contains a depression 210, that has a liner layer 215. The depression 210 is for example, a trench structure. The liner layer 215 is comprised of a conducting cobalt-tungsten alloy or a conducting nickel-tungsten alloy as described herein. The interconnect fill 220 comprises a conducting material, such as for example, copper or an alloy of copper. The liner layer 215 has a thickness of less than 100 A. In additional embodiments, the liner layer 215 has a thickness of between 30 A and 100 A or between 30 A and 50 A. Liner layers comprised of cobalt-tungsten alloy or a conducting nickel-tungsten alloy can be barriers to copper diffusion.

Figure 3:
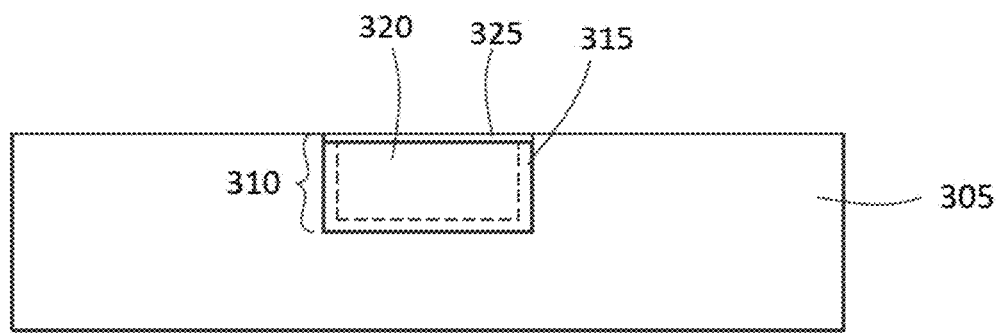
FIG. 3 is a schematic diagram illustrating a cross-sectional view of an electrical interconnect having a capping layer.

A conducting cobalt-tungsten alloy or a conducting nickel-tungsten alloy can also be a capping layer for an electrical interconnect, such as, for example, a copper containing interconnect. These alloys can act as barriers to copper diffusion. During processing, very thin electroless cobalt-tungsten alloy or a nickel-tungsten alloy (for example, a layer that is 30 A to 50 A thick) can be selectively deposited onto the exposed copper surface (post chemical mechanical polish) of a copper interconnect. A thin electroless cobalt-tungsten alloy capping layer has demonstrated 5-100× improvement of copper electron migration resistance. In embodiments, capping layers can be less than 100 A thick. FIG. 3 schematically illustrates an electrical interconnect with a capping layer. In FIG. 3, substrate 305, which can be a dielectric layer 305 on a substrate (not shown), has an electrical interconnect structure formed in a depression 310 in the dielectric layer 305. The electrical interconnect structure comprises an optional liner layer 315, a conducting fill 320 and a capping layer 325. The conducting fill 320 can be copper or a copper alloy, for example. The liner layer 315 can be a conducting cobalt-tungsten alloy or a conducting nickel-tungsten alloy as described herein or a different material. The capping layer 325 is a conducting cobalt-tungsten alloy or a conducting nickel-tungsten alloy as described herein. Vias are also possible, and in which case, the depression would typically be created through the dielectric layer 305. The dielectric layer 305 can be a material such as, for example, silicon dioxide, a low-k dielectric, silicon nitride, and or silicon oxynitride as discussed more fully herein. The dielectric layer 305 can be a single layer or multiple layers. The dielectric layer 305 can be layers of a single material or layers of different materials.

Figure 4A:
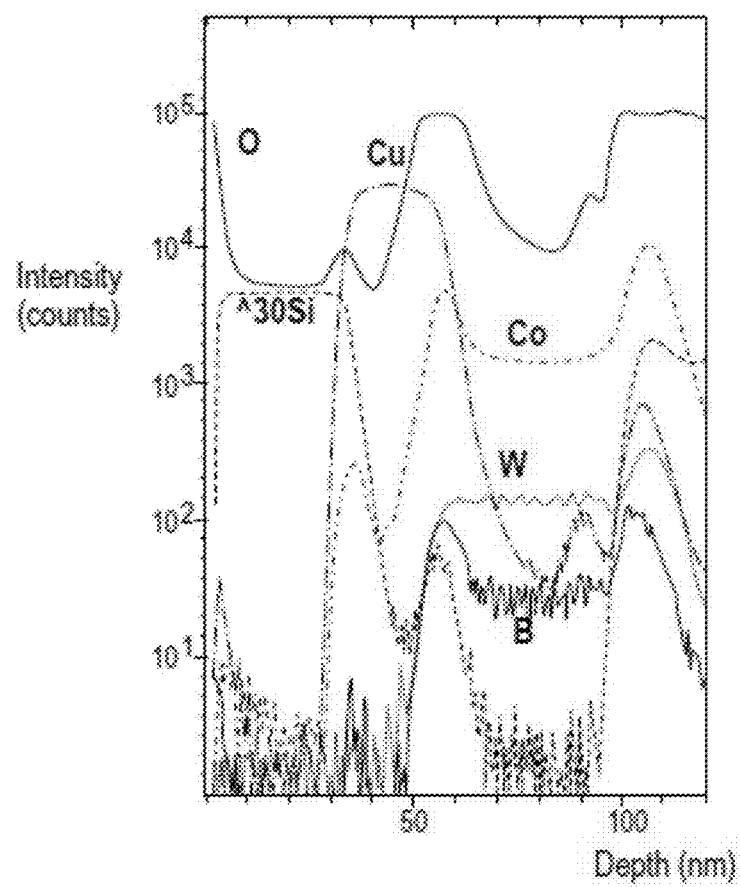
FIGS. 4A and 4B show mass spectrometry data from a structure comprising a cobalt-tungsten alloy before and after an anneal, respectively.
Figure 4B:
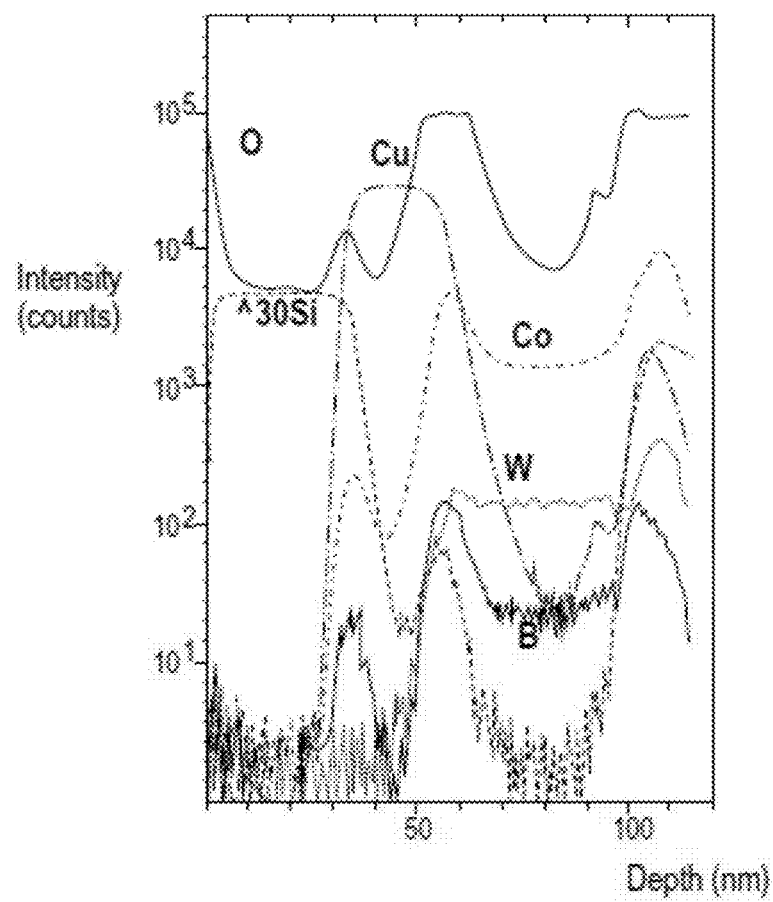

FIGS. 4A and 4B illustrate some properties of a conducting cobalt-tungsten alloy. With respect to FIGS. 4A and 4B, a stack of layers comprising a capping layer of silicon nitride, a layer of copper, and a layer of cobalt-tungsten alloy on a silicon dioxide layer were probed by TOFSIMS (time-of-flight secondary ion mass spectrometry). FIG. 4B is a layer stack similar to that of FIG. 4A after an anneal at 400° C. for 30 minutes. The cobalt-tungsten alloy had 55 atomic % cobalt, 40 atomic % tungsten, and 3-5 atomic % boron. In FIGS. 4A and 4B the copper trace is essentially unchanged from FIG. 4A to FIG. 4B which demonstrates that the anneal did not cause the copper to migrate through the cobalt-tungsten alloy layer into the silicon dioxide dielectric layer, indicating that the cobalt-tungsten alloy is capable of acting as a barrier layer for a copper-containing interconnect.

Dielectric materials useful in embodiments include, but are not limited to, silicon dioxide, low-k dielectrics, organic polymers such as, for example, perfluorocyclobutane or polytetrafluoroethylene, silicon nitrides, and or silicon oxynitrides. The dielectric layer optionally includes pores or other voids to further reduce its dielectric constant. Typically, low-k films are considered to be any film with a dielectric constant smaller than that of $SiO_2$ which has a dielectric constant of about 3.9. Low-k films having dielectric constants of about 3 to about 2.7 are commonly employed in semiconductor devices. The production of integrated circuit device structures often also includes placing a silicon dioxide film or layer, or capping layer on the surface of low-k (low dielectric constant) ILD (inter-layer dielectric) films. Low-k films can be, for example, boron-, phosphorous-, or carbon-doped silicon oxides. Carbon-doped silicon oxides can also be referred to as carbon-doped oxides (CDOs). Additional materials include fluorosilicate glass (FSG), and organosilicates such as silsesquioxane, siloxane, or organosilicate glass.

Cobalt-tungsten alloys and nickel-tungsten alloys can be formed on substrates in electroless processes, for example. Electroless processes are autocatalytic and do not require electrical energy to deposit an alloy material. An electroless bath formulation for a cobalt-tungsten alloy includes: a first metal source that can be, for example, cobalt sulfate pentahydrate, cobalt chloride, and/or cobalt hydroxide, that is present at a concentration of 1-20 g/L; a second metal source that can be, for example, sodium tungstate and/or tungstic acid, that is present at a concentration of 1-20 g/L; a first chelator that can be, for example, citric acid, EDTA (ethylenediaminetetraacetic add), acetic acid, glycine, ammonia, or malic acid, that is present at a concentration of 20-100 g/L; a second chelator that can be, for example, acetic acid, glycine, or ammonia, that is present at a concentration of 10-60 g/L; where the first chelator is not the same as the second chelator, a buffer that can be, for example, boric acid, that is present at a concentration of 5-50 g/L; and a surfactant that can be, for example, poly(ethylene glycol) having a molecular weight of 1,000 to 10,000 and/or polyoxalkylene alkyl ether, that is present at a total concentration of milligrams up to 1-2 g/L. An electroless bath formulation for a nickel-tungsten alloy includes: a first metal source that can be, for example, nickel sulfate, nickel chloride, and/or nickel hydroxide, that is present at a concentration of 1-20 g/L; a second metal source that can be, for example, sodium tungstate and/or tungstic acid, that is present at a concentration of 1-20 g/L; a first chelator that can be, for example, citric acid, EDTA (ethylenediaminetetraacetic acid), acetic acid, glycine, ammonia, or malic acid, that is present at a concentration of 20-100 g/L; a second chelator that can be, for example, acetic acid, glycine, or ammonia, that is present at a concentration of 10-60 g/L; where the first chelator is not the same as the second chelator, a buffer that can be, for example, boric acid, that is present at a concentration of 5-50 g/L; and a surfactant that can be, for example, poly(ethylene glycol) having a molecular weight of 1,000 to 10,000 and/or polyoxalkylene alkyl ether, that is present at a total concentration of milligrams up to 1-2 g/L.

The substrate on which the devices of the IC chip are built is, for example, a silicon wafer, a silicon-on-insulator substrate, or a sapphire substrate. Silicon wafers are substrates that are typically used in the semiconductor processing industry, although embodiments of the invention are not dependent on the type of substrate used. The substrate could also be comprised of germanium, indium antimonide, lead telluride, indium arsenide, indium phosphide, gallium arsenide, gallium antimonide, and or other Group III-V materials either alone or in combination with silicon or silicon dioxide or other insulating materials. Devices that make up the IC chip are built on the substrate surface(s).

The substrate also includes a plurality of layers and other devices, such as for example, insulating layers, electrical interconnections, and transistors. Transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include double-gate transistors, trigate transistors, and wrap-around gate transistors, some of which are often referred to as FinFET transistors.

Figure 5:
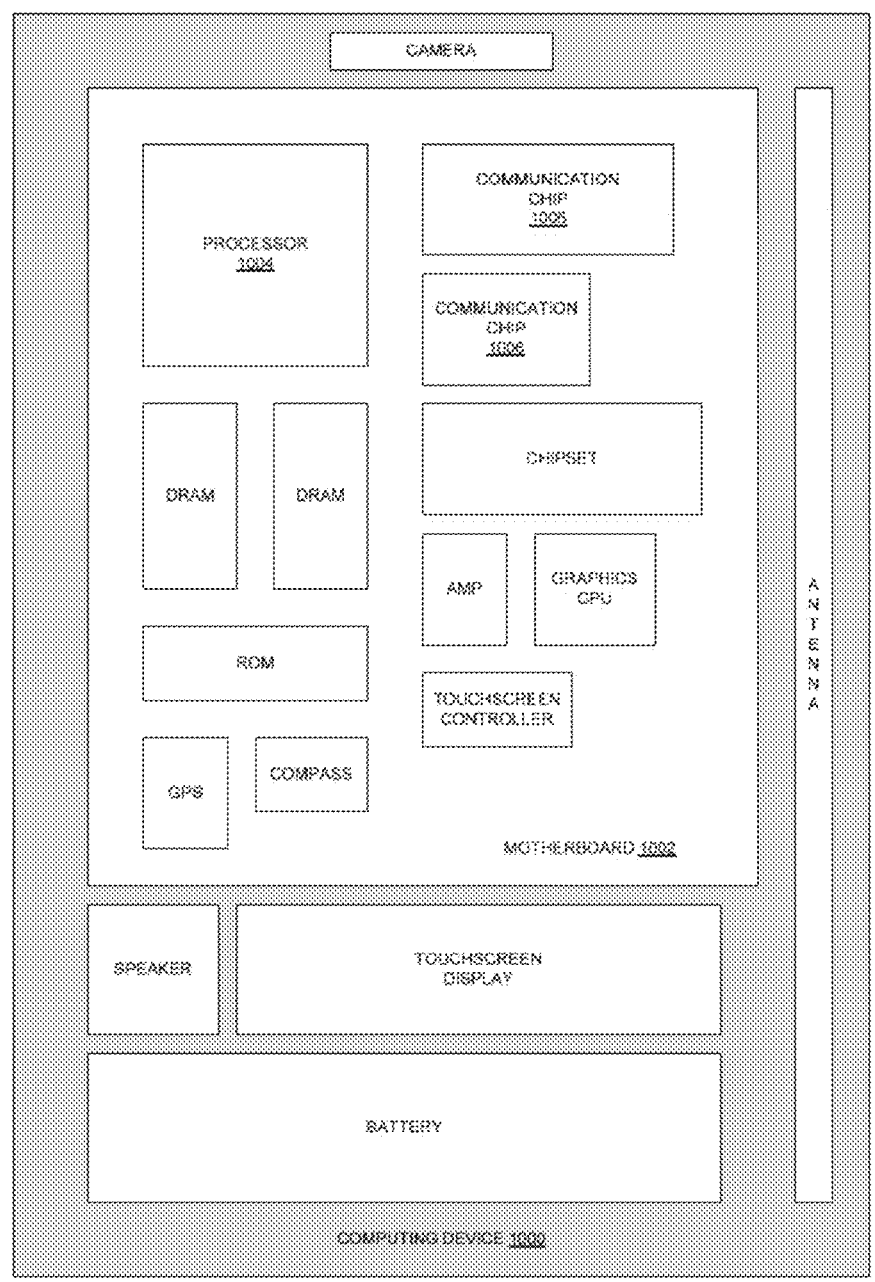
FIG. 5 is a computing device built in accordance with implementations of tungsten alloys in semiconductor devices.

FIG. 5 illustrates a computing device 1000 in accordance with one implementation of the invention. The computing device 1000 houses a motherboard 1002. The motherboard 1002 may include a number of components, including but not limited to a processor 1004 and at least one communication chip 1006. The processor 1004 is physically and electrically coupled to the motherboard 1002. In some implementations the at least one communication chip 1006 is also physically and electrically coupled to the motherboard 1002.

Depending on its applications, computing device 1000 may include other components that may or may not be physically and electrically coupled to the motherboard 1002. These other components include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes conducting interconnects between components that employ cobalt-tungsten or nickel-tungsten alloys, in accordance with implementation(s) of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation, the integrated circuit die of the communication chip includes conducting interconnects between components, that employ cobalt-tungsten and or nickel-tungsten alloys, as described herein.

In further implementations, another component housed within the computing device 1000 may contain an integrated circuit die that includes conducting interconnects between components, comprising cobalt-tungsten and or nickel-tungsten alloys, as described herein.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The above description of illustrated implementations, including what is described in the Abstract, is not intended to be exhaustive. Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Various additional layers and/or structures may be included and/or described features may be omitted in other embodiments.

We claim:

1. A semiconductor device comprising;
    a semiconductor substrate having a plurality of transistors thereon;
    a layer of dielectric material above the semiconductor substrate, wherein the dielectric material has a depression formed therein; and
    a conducting alloy material wherein the conducting alloy material fills the depression and wherein the conducting alloy material is comprised of 55 to 75 atomic percent cobalt, 20 to 40 atomic percent tungsten, and 1 to 5 atomic percent boron.

2. The device of claim 1 wherein the conducting alloy material is comprised of 60 to 70 atomic percent cobalt, 25 to 35 atomic percent tungsten, and 1 to 5 atomic percent boron.

3. The device of claim 1 wherein the depression has at least one side and the side of the depression is in direct contact with the conducting alloy material.

4. The device of claim 1 wherein the dielectric material is selected from the group consisting of silicon dioxide, perfluorocyclobutane, polytetrafluoroethylene, silicon nitride, silicon oxynitride, boron-doped silicon oxide, phosphorous-doped silicon oxide, carbon-doped silicon oxide, fluorosilicate glass, silsesquioxane, and organosilicate glass.

5. The device of claim 1 wherein the depression is a conducting interconnect between a first device and a second device on the semiconductor substrate.

6. A semiconductor device comprising;
    a semiconductor substrate having a plurality of transistors thereon;
    a layer of dielectric material above the semiconductor substrate, wherein the dielectric material has a depression formed therein; and
    a conducting alloy material wherein the conducting alloy material fills the depression and wherein the conducting alloy material is comprised of 55 to 75 atomic percent nickel, 20 to 40 atomic percent tungsten, and 1 to 5 atomic percent boron.

7. The device of claim 6 wherein the conducting alloy material is comprised of 60 to 70 atomic percent cobalt, 25 to 35 atomic percent tungsten, and 1 to 5 atomic percent boron.

8. The device of claim 6 wherein the depression has at least one side and the side of the depression is in direct contact with the conducting alloy material.

9. The device of claim 6 wherein the dielectric material is selected from the group consisting of silicon dioxide, perfluorocyclobutane, polytetrafluoroethylene, silicon nitride, silicon oxynitride, boron-doped silicon oxide, phosphorous-doped silicon oxide, carbon-doped silicon oxide, fluorosilicate glass, silsesquioxane, and organosilicate glass.

10. The device of claim 6 wherein the depression is a conducting interconnect between a first device and a second device on the semiconductor substrate.

11. A computing device comprising;
    a motherboard;
    a communication chip mounted on the motherboard; and
    a processor mounted on the motherboard operably coupled to the communication chip, the processor comprising:
    a semiconductor substrate having a plurality of transistors thereon;
    a layer of dielectric material above the semiconductor substrate, wherein the dielectric material has a depression formed therein; and
    a conducting alloy material wherein the conducting alloy material fills the depression and wherein the conducting alloy material is comprised of 55 to 75 atomic percent cobalt or nickel, 20 to 40 atomic percent tungsten, and 1 to 5 atomic percent boron.

12. The device of claim 11 wherein the conducting alloy material is comprised of 60 to 70 atomic percent cobalt or nickel, 25 to 35 atomic percent tungsten, and 1 to 5 atomic percent boron.

13. The device of claim 11 wherein the depression has at least one side and the side of the depression is in direct contact with the conducting alloy material.

14. The device of claim 11 wherein the dielectric material is selected from the group consisting of silicon dioxide, perfluorocyclobutane, polytetrafluoroethylene, silicon nitride, silicon oxynitride, boron-doped silicon oxide, phosphorous-doped silicon oxide, carbon-doped silicon oxide, fluorosilicate glass, silsesquioxane, and organosilicate glass.

15. The device of claim 11 wherein the depression is a conducting interconnect between a first device and a second device on the semiconductor substrate.

* * * * *